(12) United States Patent
Zhao et al.

(10) Patent No.: US 6,895,776 B2
(45) Date of Patent: May 24, 2005

(54) ANTI-STRATIFICATION-SOLUTION DELIVERY SYSTEM FOR SPIN-ON DIELECTRICS

(75) Inventors: Jun Zhao, Cupertino, CA (US); Rick J. Roberts, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 48 days.

(21) Appl. No.: 10/617,902

(22) Filed: Jul. 10, 2003

(65) Prior Publication Data

US 2005/0005629 A1 Jan. 13, 2005

(51) Int. Cl.[7] .......................... B67D 5/62; H01L 21/44; B01F 5/10
(52) U.S. Cl. .......................... 62/392; 438/669; 366/146
(58) Field of Search .................. 62/392, 435; 222/190, 222/146.6, 53, 56; 438/669; 366/146; 436/692

(56) References Cited

U.S. PATENT DOCUMENTS

| | | |
|---|---|---|
| 2,703,966 A | 3/1955 | Snelson |
| 3,159,982 A | 12/1964 | Schachner |
| 4,353,223 A | 10/1982 | Dienemann |
| 4,814,786 A * | 3/1989 | Hoisington et al. ........... 347/88 |
| 5,750,440 A | 5/1998 | Vanell et al. |
| 5,810,899 A | 9/1998 | Fukuoka |
| 5,823,676 A * | 10/1998 | Khijniak et al. ............ 366/348 |
| 5,993,053 A * | 11/1999 | Clark ......................... 366/146 |
| 6,098,843 A | 8/2000 | Soberanis et al. |

* cited by examiner

*Primary Examiner*—Chen Wen Jiang
(74) *Attorney, Agent, or Firm*—Townsend & Townsend & Crew (57) ABSTRACT

An anti-stratification-delivery system comprises a multi-zone-refrigeration unit having at least first and second zone temperature controllers, the first and second zone temperature controllers are capable of being set at different temperatures to establish a temperature gradient in a liquid, the temperature gradient being sufficient to cause natural-thermal convection within the liquid to stir a colloid suspended in the liquid to an approximately uniform-colloidal suspension; and a delivery system configured to dispense the approximately uniform-colloidal suspension.

41 Claims, 4 Drawing Sheets

ANTI-STRATIFICATION-SOLUTION DELIVERY SYSTEM FOR SPIN-ON DIELECTRICS

BACKGROUND OF THE INVENTION

The present invention relates to an apparatus and method for storing, mixing and/or dispensing a fluid. More specifically, embodiments of the invention relate to an apparatus and method for storing, mixing and/or dispensing fluid to a substrate processing system. Embodiments of the invention are particularly useful for storing and dispensing spin-on-dielectric (SOD) formulations but may also be used to store and dispense other fluid formulations, such as chemical mechanical polishing (CMP) solutions and others.

Semiconductor device geometries have dramatically decreased in size since integrated circuits were first introduced several decades ago, and all indications are that this trend will continue. Although today's wafer fabrication plants are routinely producing ever-shrinking devices, the plants of the future will soon be producing devices having even smaller geometries.

In order to continue to reduce the size of devices on integrated circuits, it has become necessary to use insulators having low dielectric constants. Such films are particularly desirable for premetal dielectric (PMD) layers and intermetal dielectric (IMD) layers to reduce the RC time delay of the interconnect metalization, to prevent crosstalk between the different levels of metalization, to reduce signal reflection, and to reduce device power consumption. To this end, several semiconductor manufacturers, materials suppliers, and research organizations have focused on identifying low-dielectric-constant films. As used herein, low-dielectric-constant (low-k) films are those having a dielectric constant below 3.0 including films having a dielectric constant below 2.0.

Some approaches to developing such low-k films include introducing porosity into known dielectric materials to reduce the material's dielectric constant. Dielectric films when made porous, tend to have lower dielectric constants (the dielectric constant of air is normally 1.0). One particular class of porous low-k films includes mesoporous silica materials. One known method of forming such mesoporous silica films is referred to as the sol gel process, in which high porosity films are produced by hydrolysis and polycondensation of a metal oxide.

The sol gel process is a versatile solution process for making ceramic material. In general, the sol gel process involves the transition of a system from a liquid "sol" (mostly colloidal) into a solid "gel" phase. The starting materials used in the preparation of the sol are usually inorganic metal salts or metal organic compounds such as metal alkoxides. The precursor solutions are typically deposited on a substrate by spin on methods. In a typical sol gel process, the precursor is subjected to a series of hydrolysis and polymerization reactions to form a colloidal suspension, or a sol. Further processing of the sol enables one to make ceramic materials in different forms. One method of forming such mesoporous low-k films is described in U.S. application Ser. No. 09/823,932, filed on Mar. 29, 2001 in the name of Robert P. Mandel et al. and assigned to Applied Materials, Inc., the assignee of the present case. The Ser. No. 09/823,932 application is hereby incorporated by reference in its entirety.

Some low-k SOD formulations have a variety of constituent colloids with highly variant densities. In the sol-gel phase, these variant densities cause the constituent colloids of the SOD formulation to stratify. Dispensing stratified SOD formulations may result in the formation low-k films having spatially varying irregularities, such as varying film thickness, refractive index, and dielectric constant among other undesirable properties. Vessels have been developed for mixing low-k SOD formulations to relatively homogeneous consistency prior to dispensing. Such vessels typically mix the SOD formulations by mechanical agitation. One typical agitation mechanism includes, a set of mixing blades inserted in a vessel. The blades are rotated or plunged up and down to mix the SOD formulation and reduce stratification. Other typical agitation mechanisms include a vibration mechanism attached to the vessel that shakes the vessel and hence mixes the SOD formulations contained therein.

Mechanical mixing vessels have been used with some success to mix and dispense low-k SOD formulations in semiconductor fabrication facilities. Such vessels are not without shortcomings, however. For example, during a mechanical mixing process, such as a vibration mixing process, colloid in the low-k SOD formulation is washed onto the walls of the mixing vessel where the colloid condenses to form particles. Continued agitation causes these particles to shed from the walls of the mixing vessel back into the SOD formulation. Upon being mixed back into the SOD formulation, the particles do not dissolve into their constituent parts, but remain as particles, forming impurities in the SOD formulation. The result of dispensing these particles with the low-k SOD formulation is the formation of low-k films having spatially varying irregularities that may adversely affect semiconductor devices. Agitation mechanisms have other shortcomings, such as shedding of particles of the vessel itself into the low-k SOD formulation which may also cause spatially varying irregularities in formed low-k films.

In addition to having a tendency to stratify, some low-k SOD formulations have highly reactive chemistries that have inherently short shelf lives at room temperature (21° C.). At room temperature, some low-k SOD formulations degrade within 24–48 hours. For example, MesoELk™ SOD formulation, a silicon oxide low-k film precursor manufactured by Schumacher, a unit of Air Products and Chemicals, Inc., chemically degrades within approximately 24 hours at room temperature. However, at about −10° C. MesoELk™ SOD formulation can be kept chemically stable for greater than 30 days. Similar to dispensing a stratified or nonuniformly mixed low-k SOD formulation, dispensing chemically degraded SOD formulations yield dielectric films having spatially varying irregularities, such as varying film thicknesses, refractive indexes, and dielectric constants among other undesirable properties.

Accordingly, there is a need for new techniques and mechanisms for storing, mixing, and dispensing solutions, such as SOD formulations, to substrate processing systems.

BRIEF SUMMARY OF THE INVENTION

Embodiments of the present invention are directed to an anti-stratification solution delivery system and method that does not engender the problems described above and provides natural thermal-convection mixing and dispensing of a colloid and liquid, such as a low-k spin-on-dielectric (SOD) precursor. In some embodiments the anti-stratification delivery system provides refrigeration of the spin-on-dielectric precursor so that it can be cooled below its thermal-chemical breakdown temperature.

In one embodiment of the present invention, an anti-stratification solution delivery system is provided. The solution delivery system comprises a multi-zone-refrigeration unit having at least first and second temperature controllers, that are capable of being set at different temperatures to establish a temperature gradient in a liquid sufficient to cause natural thermal convection within the liquid to stir a colloid suspended in the liquid to an approximately uniform-colloidal suspension. The system also includes a delivery system configured to dispense the colloidal suspension to a substrate processing system or other appropriate tool. In some embodiments, a bottle cavity is disposed in the multi-zone-refrigeration unit. A bottle containing the liquid and colloid can be placed in the bottle cavity.

In accordance with another embodiment of the invention, a method for dispensing a colloid and liquid is provided. The method comprises establishing a temperature gradient in the liquid and the colloid; mixing the liquid and the colloid by natural thermal convection to an approximately uniform colloidal suspension; setting a maximum temperature of the temperature gradient below an upper colloid-chemical-breakdown temperature; and dispensing the approximately uniform colloidal suspension through a dispensing system. In some embodiments the method provides that the liquid and colloid form a low-k spin-on-dielectric precursor.

In accordance with another embodiment of the invention, an apparatus is provided for storing, mixing, and dispensing a liquid solution to a semiconductor processing tool. The apparatus comprising a housing that includes a thermally conductive material. The housing has at least first and second sections that combine to form a cavity, the first and second section are configured to be set at different temperatures. The apparatus also comprises a thermal insulator that includes a low thermal conductive material, the thermal insulator separates the first and second section of the housing. A lid is attached to the housing and is configured to be removable to allow insertion and removal of a bottle from the cavity, the lid comprises an opening to allow for the insertion of a draw tube into a bottle. The apparatus also comprises an insulating casing that at least partially surrounds the housing. In some embodiments, a bottle suitable for containing the liquid solution is positioned within the cavity formed by the housing. In another embodiment, a first portion of the bottle is in thermal contact with an interior surface of the first section of the housing and a second portion of the bottle is in thermal contact with an interior surface of the second section of the housing.

In accordance with another embodiment of the invention, a method is provided for forming an integrated circuit. The method comprises mixing a spin-on-dielectric (SOD) formulation by natural thermal convection. The mixing step includes exposing a first portion of the SOD formulation to a first temperature and exposing a second portion of the SOD formulation to a second temperature. The difference between the first and second temperatures is sufficient to mix the SOD formulation to an approximately uniform colloidal suspension. The method further includes dispensing the SOD formulation onto a substrate; and forming a low-k dielectric layer from the SOD formulation. In some embodiment, the forming step includes curing the SOD formulation to form the low-k dielectric layer. In another embodiment the formed low-k dielectric layer has a dielectric constant below about 3.0, and in yet another embodiment, the formed low-k dielectric layer has a dielectric constant below about 2.0.

These and other embodiments of the present invention, as well as its advantages, are described in more detail in conjunction with the description below and the attached figures.

DETAILED DESCRIPTION OF THE INVENTION

Embodiments of the present invention are directed toward anti-stratification delivery systems (ADSs) and particularly toward a multi-zone refrigeration unit (MZRU), which provides natural thermal-convection mixing of solutions contained within an ADS. Embodiments of the present invention are of particular use for natural thermal-convection mixing of spin-on-dielectric (SOD) formulations or other colloidal suspensions, which tend to stratify in liquid. Embodiments of the invention include MZRUs having zone cooler and/or zone heaters, which create thermal gradients in an SOD formulation contained within an MZRU. Thermal gradients are regions within the SOD formulation, or other solution, that are at different temperatures. Due to pressure gradients generated by the thermal gradients, regions of the SOD formulation having disparate temperatures tend to mix by natural thermal convection.

According to embodiments of the present invention, thermal gradients created by zone coolers and/or zone heaters are sufficient to mix, by natural thermal convection, a stratified SOD formulation to a relatively homogeneous consistency prior to dispensing. Zone coolers and zone heaters are collectively referred to herein as zone temperature controllers. Dispensing homogeneous SOD formulations enables the formulation of low-k dielectric films having relatively spatially uniform dielectric constants, thicknesses, and refractive indices among other physical properties. Dielectric films having the aforementioned characteristics are of particular use in the semiconductor-fabrication industry for the formation of integrated circuits, having minimum feature sizes of 0.13 microns and less.

An MZRU having zone coolers, according to embodiments of the present invention, are set at sufficiently low temperatures to chemically stabilize an SOD formulation. For example, for a given SOD formulation having a chemical stability range of −30° C. to −5° C., zone coolers according to the present invention may be set at disparate temperatures within this range to provide both natural thermal-convective mixing and chemically stabilizing temperatures.

Because embodiments of the present invention provide SOD formulation cooling, mixing, and dispensing, the need for multiple pieces of equipment that provide only one or possibly two of these function is reduced, if not eliminated, thus reducing equipment costs. For example, in a typical wafer fabrication facility, SOD formulations are typically stored in refrigeration units that are not configured to mix and dispense SOD formulations. Accordingly, the need for such refrigeration units may be reduced, or may even be eliminated, by embodiments of the present invention.

Figure 1A:
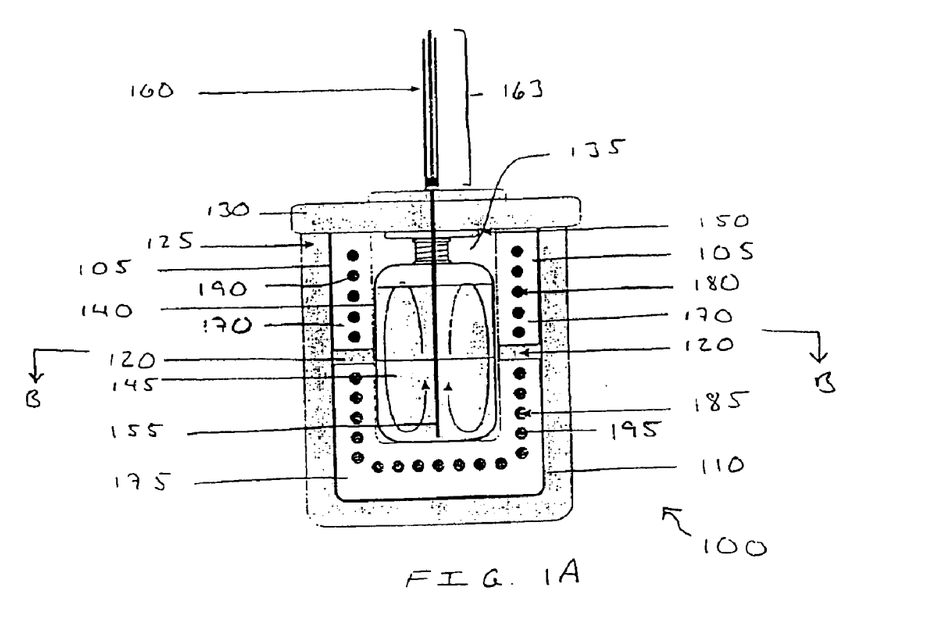
FIG. 1A shows a cross-sectional view of a multi-zone-refrigeration unit having zone coolers according to an embodiment of the present invention.

FIG. 1A shows a cross-sectional view of a multi-zone-refrigeration unit (MZRU) 100 according to an embodiment of the present invention. Various constituent elements of MZRU 100 will be briefly described prior to a detailed discussion of the function of the elements. MZRU 100 includes first and second zone coolers 105 and 110, respectively. The zone coolers are separated by a thermal insulator 120. A thermal insulator 125 including a thermal-insulating cap 130 surround the zone coolers. The zone coolers have a bottle cavity 135 for receiving a bottle 140, which is configured to contain a colloidal suspension 145, such as an SOD formulation. A bottle seal 150 is removably attached to the top of bottle 140 and is configured to seal the contents of the bottle. MZRU 100 further includes a draw tube 155 that extends through insulating cap 130 and bottle seal 150 into bottle 140. A draw-tube insulator 160 surrounds an upper portion 163 of draw tube 155, which extends from the insulating cap 130.

According to one embodiment, the temperatures of the first and second zone coolers are independently controllable and are set at first and second temperatures, respectively. The first and second temperatures are both set below a thermal breakdown temperature of colloidal suspension 145 contained within the MZRU. Thus the MZRU is of use for storing a colloidal suspension for an extended period of time. According to one embodiment, the higher of the first and second temperatures is set at or below about −10° C. According to a further embodiment, the average temperature of the colloidal suspension 145 is maintained at approximately −15° C. Thus MZRU 100 provides a temperature range in which MesoELk™ SOD formulation can be kept chemically stable for about 30 days.

According to one embodiment, zone cooler 105 includes a housing 170 and zone cooler 110 includes a housing 175. Housings 170 and 175 have relatively high thermal conductivity so that thermal energy is efficiently passed between the colloidal suspension 145 and the housings. According to one embodiment, housings 170 and 175 are formed from aluminum, copper, carbon steel or alloys of these metals. Person of skill in the art will realize a number of suitable materials that can be used. As referred to herein after, "aluminum," and "copper" will be used to refer to these metals and alloys of these metals.

Figure 1B:
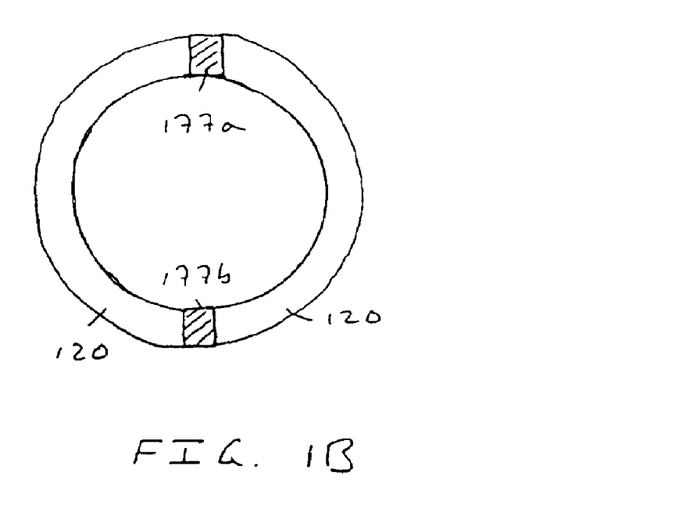
FIG. 1B shows a top cross-sectional view of a multi-zone-refrigeration unit having zone coolers according to an embodiment of the present invention.

FIG. 1B shows a top cross-sectional view of MZRU 100 along line B—B of FIG. 1A. According to the embodiment shown in the figure, thermal insulator 120 physically separates zone coolers 105 and 110 and provides thermal insulation between the zone coolers. According to one embodiment portions of housings 170 and 175 are connected by a structural support sections 177a and 177b which may be formed of the same material as the housings, for example, aluminum. Thermal insulator 120 may be formed from fluoropolymers, such as polytetrafluoroethylene (PTFE), perfluoro alkoxy alkane (PFA), ethylene chlorotrifluoroethylene, fluorinated perfluoroethylene-propylene or the like. According to one embodiment thermal insulator 120 is formed from polyethylene, high density polyethylene or the like. Other materials having relatively low thermal conductivity, for example, about 0.5 W/mK or less, are also useful for forming thermal insulator 120.

Figure 1C:
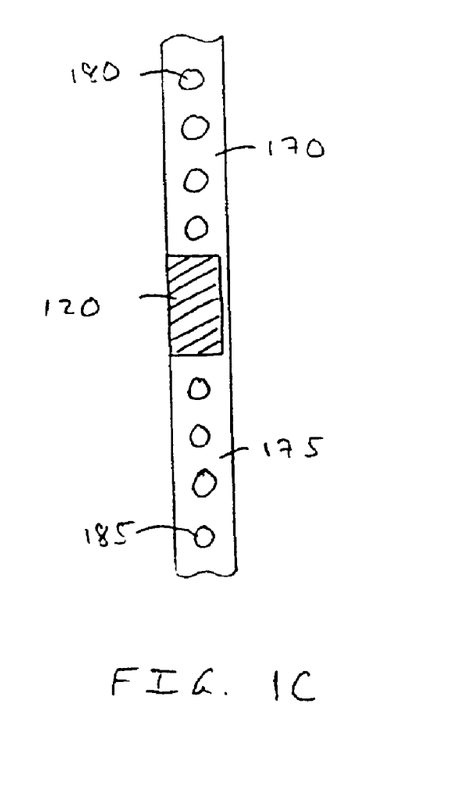
FIG. 1C shows a side cross-sectional view of a wall portion of a multi-zone-refrigeration unit having zone coolers according to another embodiment of the present invention.

FIG. 1C shows a side cross-sectional view of a wall portion of MZRU 100, according to an embodiment of the present invention. According to the embodiment shown in FIG. 1C, thermal insulator 120 provides thermal insulation between zone coolers 105 and 110. The thermal insulator is positioned in a cavity 122, having walls 122a, 122b, and 122c. To provide structural rigidity between the zone coolers, the zone coolers are attached by a wall 112 formed from the same material as the housings 170 and 175. While FIGS. 1A–1C show specific configurations for thermal insulator 120, those of skill in the art will no doubt recognize other useful configurations for the insulator.

According to one embodiment, housings 170 and 175 include a respective first and second fluidically isolated channels 180 and 185 through which coolants 190 and 195, respectively, are passed. According to one embodiment, coolants 190 and 195 are the same material but are introduced into their respective channels 180 and 185 at different temperatures. According to an alternate embodiment, coolants 190 and 195 are different materials and are introduced into their respective channels 180 and 185 at different temperatures. Coolants 190 and 195 include any of a variety of well known cooling materials, such as cooled gases and/or cooled liquids.

A refrigeration unit (not shown) is used to cool fluids pumped through channels 180 and 185. According to one embodiment, channels 180 and 185 are each spiral in shape with a cooled gas or liquid introduced at an end of the spiral and collected at other end of the spiral. According to an alternate embodiment, each individual channel of channels 180 and 185 are not interconnected but has a port into which cooled gas or liquid is introduces and another port from which the gas or liquid is removed. Refrigeration unit of use include, for example, vapor compression refrigeration units that can be used to cool a gas or liquid prior to introducing the gas or liquid into the channels. According to an alternative embodiment, channels 180 and 185 may be the channels of a vapor compression refrigeration unit through which refrigerant gases, such as various chlorofluorocarbons, are passed. Those of skill in the art will no doubt know of other useful refrigeration units for cooling gases or liquids.

The thermal insulator 125 and thermal-insulating cap 130 surround the zone coolers and thermally insulate the zone coolers from an atmosphere surrounding the MZRU 100. Thermal insulator 125 forms a cavity in which zone coolers 105 and 110 are positioned. The thermal insulating cap 130 is separable from thermal insulator 125 so that bottle 140 may be easily placed in or removed from bottle cavity 135. For example, cap 130 may be threaded onto insulator 125, or alternatively may be held in place by screws or other clamping devices. Insulator 125 and cap 130 may be formed from a variety of insulating materials having a relatively low thermal conductivity, such as ceramic or organic compounds. According to one embodiment, insulator 125 and cap 130 have a thermal conductivity about 0.5 watts per meter kelvin or less.

According to one embodiment a set of temperature sensors (not shown) is used to monitor the average temperature of the colloidal suspension. The temperature sensors may be any of a variety of well known devices, such as bimetal devices, liquid crystal devices, and the like. The temperature sensors may be placed in a variety of locations to monitor temperature, such as in the bottle or adjacent to the bottle. Feedback from the temperature sensors is used to adjust the first and second temperatures to maintain the average temperature at an approximately constant level. For example, as the colloidal suspension is dispensed and the level of the suspension drops, one zone cooler (e.g., zone cooler 110 lower) may influence the temperature more than the other zone cooler (e.g., zone cooler 105 upper). Accordingly, output from the set of temperature sensors is used to compensate for this unbalanced influence by adjusting the temperature of one or both of zone coolers 105 and 11O.

The temperature difference between the first and second temperatures establishes a temperature gradient within the colloidal suspension such that natural thermal-convection churns and mixes the colloidal suspension. In churning and mixing the stratified colloidal suspension a relatively uniform colloidal suspension is produced and is kept from restratifying. According to the embodiment shown in FIG. 1, the temperature gradient established by zone coolers 105 and 110 is a vertical temperature gradient as the zone coolers are vertically disposed with respect to one another.

Bottle 140 is fabricated from a material that is effectively not chemically reactive or has a relatively low chemical reactivity with the colloidal suspension. According to one embodiment, bottle 140 is fabricated from a fluoropolymer, such as polytetrafluoroethylene (PTFE), perfluoro alkoxy alkane (PFA), ethylene chlorotrifluoroethylene, fluorinated perfluoroethylene-propylene or the like. According to another embodiment, bottle 140 is fabricated from polyethylene, high density polyethylene or the like. According to another embodiment, bottle 140 is fabricated from stainless steel or other nonchemically reactive metal. According to another embodiment, bottle 140 is fabricated from fused quartz or a nonchemically reactive glass.

Draw tube 155 is fabricated from a material that is effectively not chemically reactive or has a relatively low chemical reactivity with the colloidal suspension. The draw tube is configured to dispense the colloidal suspension from the bottle 140. According to one embodiment, a pump (not shown) is used to pump the colloidal suspension through the draw tube. According to another embodiment, an inert gas, for example helium gas, is pumped into the bottle displacing the colloidal suspension and forcing it through the draw tube for dispensing. Draw-tube insulator 160 surrounding an upper portion 163 of the draw tube provides thermal insulation between draw tube portion 163 and the outside atmosphere. Thermally insulating the colloidal suspension during dispensing reduces the chance the colloid will chemically breakdown during a dispensing process.

Figure 2:
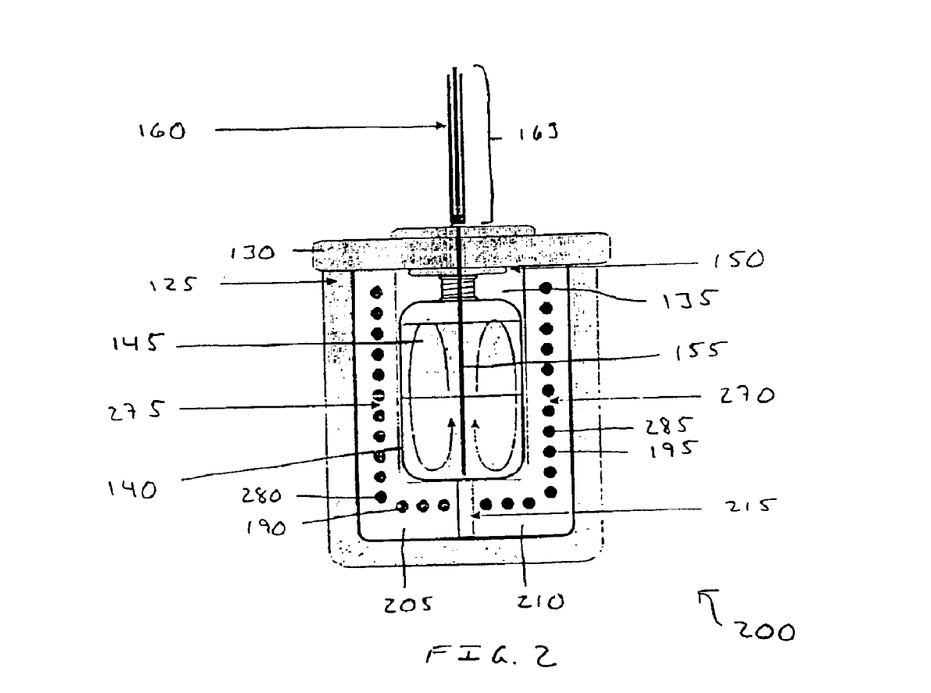
FIG. 2 shows a cross-sectional view of a multi-zone-refrigeration unit according to another embodiment of the present invention.

FIG. 2 shows a cross-sectional view of an MZRU 200 according to another embodiment of the present invention. Various constituent elements of MZRU 200 are briefly described prior to a detailed discussion of the function of the elements. The same numeral scheme is used for constituent elements of MZRU 200 that are the same as or similar to constituent elements of MZRU 100. MZRU 200 includes first and second zone coolers 270 and 275, respectively. The zone coolers are separated by a thermal insulator 215. A thermal insulator 125 including a thermal insulating cap 130 surrounds zone coolers 270 and 275. The zone coolers have a bottle cavity 135 for receiving a bottle 140, which is configured to contain a colloidal suspension 145, such as a low-k SOD formulation. A bottle seal 150 is removably attached to the top of bottle 140 and is configured to seal the contents of the bottle. MZRU 200 further includes a draw tube 155 that extends through insulating cap 130 and bottle seal 150 into bottle 140. A draw tube insulator 160 surrounds an upper portion 163 of draw tube 155, which extends from the insulating cap 130.

MZRU 200 shown in FIG. 2 differs from MZRU 100 shown in FIG. 1 in that the zone coolers 270 and 275 of MZRU 200 are positioned horizontally adjacent rather than vertically adjacent. Similar to zone coolers 170 and 175, the temperatures of zone coolers 270 and 275 are independently controllable. According to one embodiment, the temperatures of zone coolers 270 and 275 are disparately set to establish a thermal gradient in colloidal suspension 145. The temperature gradient is set such that the colloid upon settling and stratifying is churned and mixed to a relatively uniform-colloidal suspension, which is dispensed through draw tube 155. Other characteristics of MZRU 200 are the same as or similar to MZRU 100 described above. For example, zone coolers 270 and 275 have first and second fluidically isolated channels 280 and 285 through which coolants 190 and 195, respectively, are passed to establish the thermal gradient in the colloidal suspension. According to one embodiment, MZRU 200 includes a set of temperature sensors (not shown), such as those discussed above with respect to MZRU 100.

Figure 3:
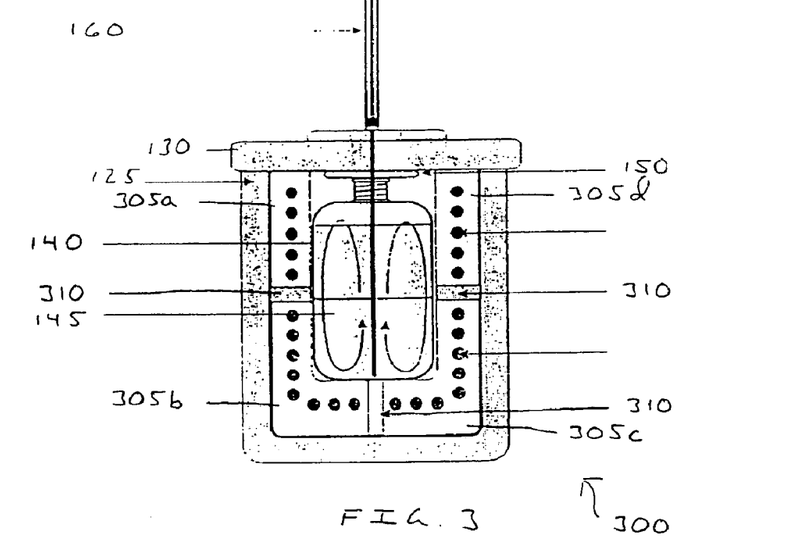
FIG. 3 shows a cross-sectional view of a multi-zone-refrigeration unit according to another embodiment of the present invention.

FIG. 3 shows a cross-sectional view of an MZRU 300 according to another embodiment of the present invention. Various constituent elements of MZRU 300 are briefly described prior to a detailed discussion of the function of the elements. The same numeral scheme is used for constituent elements of MZRU 300 that are the same as or similar to constituent elements of MZRU 100. MZRU 300 includes a set of zone coolers 305 with each zone cooler labeled with the base reference numeral 305 and an alphabetic suffix. While MZRU 300 is shown as having four zone coolers 305a, 305b, 305c, and 305d in the set 305, the set may include three zone coolers or, alternatively, may include more than four zone coolers. The zone coolers 305a–305d are separated by thermal insulators 310. A thermal insulator 125 including a thermal insulating cap 130 surrounds the set of zone coolers 305. The set of zone coolers have a bottle cavity 135 for receiving a bottle 140, which is configured to contain a colloidal suspension 145, such as a low-k SOD formulation. A bottle seal 150 is removably attached to the top of bottle 140 and is configured to seal the contents of the bottle. MZRU 300 further includes a draw tube 155 that extends through insulating cap 130 and bottle seal 150 into bottle 140. A draw tube insulator 160 surrounds an upper portion 163 of draw tube 155 that extends from the insulating cap 130.

MZRU 300 differs from MZRUs 100 and 200 in that MZRU 300 has a greater number of zone coolers than MZRUs 100 and 200. The temperatures of zone coolers 305a–305d are independently controllable. According to one embodiment, at least two of the zone coolers are set at disparate temperatures such that a temperature gradient is established in the colloid suspension 145 and is sufficient to churn and mix a stratified colloid to a relatively uniform colloidal suspension prior to dispensing.

According to one embodiment, MZRU 300 includes a set of temperature sensors (not shown), such as those discussed above with respect to MZRU 200. Output from the temperatures sensors are of use to independently control the temperature of each of zone coolers 305a–305d.

Figure 4:
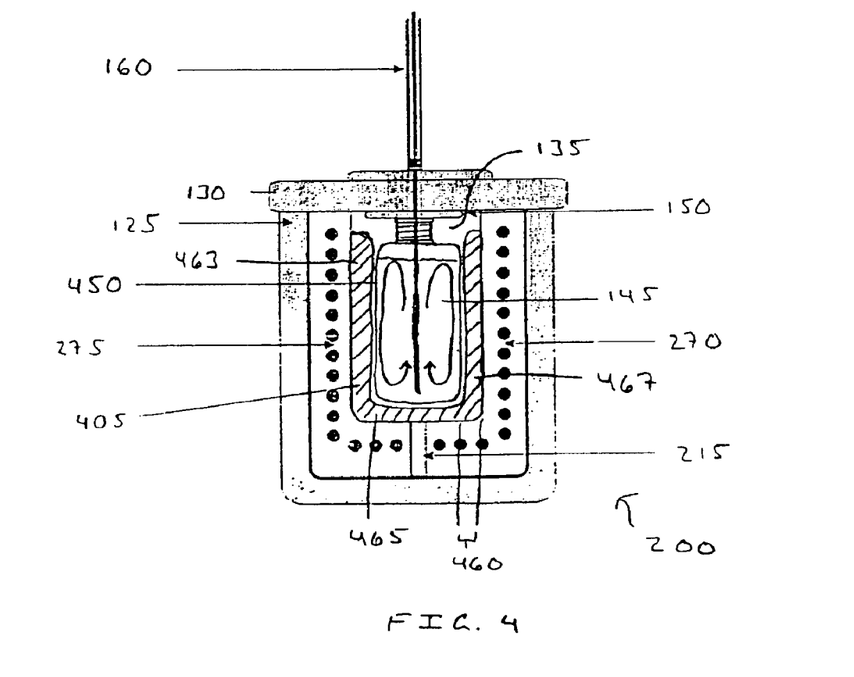
FIG. 4 shows a cross-sectional view of a multi-zone-refrigeration unit having a thermally conductive sleeve according to an embodiment of the present invention.

According to one embodiment of the present invention, a thermally conductive sleeve 405, which is configured to receive a bottle 450, is disposed in bottle cavity 135 of MZRU 200, see FIG. 4. The thermally conductive sleeve is configured to be insertable and removable from the MZRU's bottle cavity. Thermally conductive sleeve 405 being insertable and removable, allows bottle 450 having a different size than bottle 140 (FIG. 2) to be used with MZRU 200. Thermally conductive sleeve 405 has sufficiently high thermal conductivity so that zone coolers 270 and 275, set at different temperatures, establish a temperature gradient in the colloidal suspension. The temperature gradient is sufficient to churn and mix stratified colloid to a relatively uniform-colloidal suspension.

Figure 5:
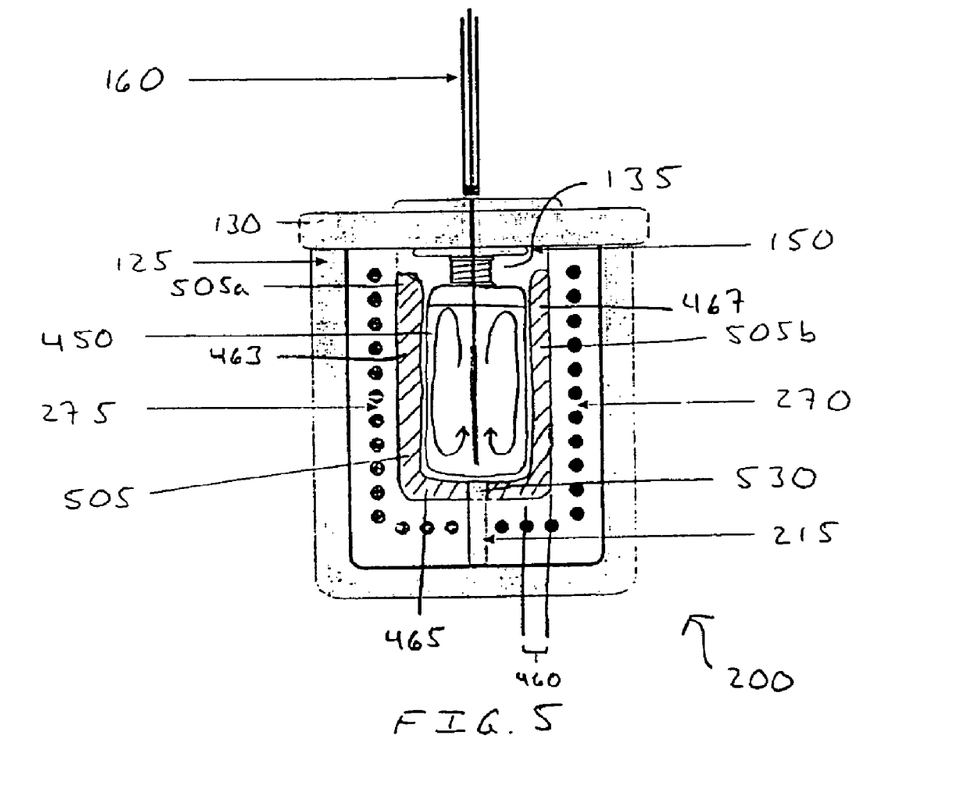
FIG. 5 shows a cross-sectional view of a multi-zone-refrigeration unit having a thermally conductive sleeve according to another embodiment of the present invention.

According to one embodiment, a thermally conductive sleeve 505 includes a thermal insulator 530 disposed between conductive regions 505a and 505b of thermally conductive sleeve 505, see FIG. 5. Thermal insulator 530 is disposed proximate to thermal insulators 215 disposed between the zone coolers 270 and 275.

According to various embodiments, a wall thickness 460 of thermally conductive sleeves 405 and 505 may be set to a variety of widths to accommodate bottles of various sizes. According to other embodiments, the walls 463, 465, and 467 of thermally conductive sleeves 405 and 505, have a variety of shapes for receiving bottles having a corresponding variety of shapes. For example, according to some embodiments, walls 463, 465, and 467 have an approximately conical shape, frustum shape, or other useful shape.

While thermally conductive sleeves 405 and 505 have been characterized as being used in conjunction with MZRU 200, according to some embodiments the sleeves are used in conjunction with MZRUs 100 and 300. In conjunctive use with MZRUs 100 and 300, thermal insulator 530, of thermal conductive sleeve 505, is located proximate to thermal insulators 120 and 310 of MZRUs 100 and 300, respectively.

It is to be understood that the above description is intended to be illustrative and not restrictive. Many alternative and equivalent embodiments of the present invention will be apparent to those of skill in the art upon reviewing the above description. By way of example, the invention described herein has been illustrated as having a bottle inserted into a bottle cavity for containing a colloidal suspension, alternatively the colloidal suspension may be placed directly into the bottle cavity for storing and mixing without the use of a bottle. Additionally, those of skill in the art will recognize that the MZRU embodiments described herein will effectively churn and mix a colloidal suspension by natural thermal convection without the use of a thermal insulator surrounding the zone coolers, such as thermal insulator 120 and thermal insulating cap 150. Further, while the MZRU embodiments are described herein as having zone coolers, the MZRUs alternatively have zone heaters or a combination of zone coolers and zone heaters for establishing a temperature gradient in a colloidal suspension. For example, one zone cooler can be used to cool a colloidal suspension to a relatively low temperature and a resistive zone heater can be used to heat the cooled colloidal suspension to the desired average temperature, for example 5–10° C. Zone coolers and zone heaters are collectively referred to herein as zone temperature controllers. Still further, while the MZRUs embodiments described herein have been characterized as being useful for churning and mixing a colloidal suspension by natural embodiments of the present invention are of use to churn and mix natural thermal convection, such as chemical mechanical polishing (CMP) or others colloidal suspensions. Each of these equivalents and alternative embodiments are considered to be within the scope of the present invention. Therefore, the scope of the invention should not be limited by the above description, but instead d with reference to the following claims, along with the full scope which such claims are entitled.

What is claimed is:

1. An anti-stratification-delivery system comprising:
   a multi-zone-refrigeration unit having at least first and second zone temperature controllers, the first and second zone temperature controllers are capable of being set at different temperatures to establish a temperature gradient in a liquid, the temperature gradient being sufficient to cause natural thermal convection within the liquid to stir a colloid suspended in the liquid to an approximately uniform colloidal suspension; and
   a delivery system configured to dispense the approximately uniform colloidal suspension.

2. The anti-stratification delivery system of claim 1 wherein the multi-zone-refrigeration unit forms a bottle cavity; and the anti-stratification delivery system further comprises a bottle disposed in the bottle cavity, the bottle configured to contain the liquid and the colloid.

3. The anti-stratification delivery system of claim 1 further comprising a thermal insulator disposed around a portion of the multi-zone-refrigeration unit, the thermal insulator configured to insulate the multi-zone-refrigeration unit from an outside atmosphere.

4. The anti-stratification delivery system of claim 1 further comprising a thermal insulator disposed between the first and second zone temperature controllers.

5. The anti-stratification delivery system of claim 1 wherein the first and second zone temperature controllers are respective first and second zone coolers.

6. The anti-stratification delivery system of claim 1 wherein the first zone temperature controller is a zone heater and the second zone temperature controller is a zone cooler.

7. The anti-stratification delivery system of claim 1 further comprising:
   a thermally conductive sleeve disposed in the bottle cavity, the thermally conductive sleeve configured to be removable from the bottle cavity;
   wherein the bottle is disposed in the thermally conductive sleeve.

8. The anti-stratification delivery system of claim 7 wherein the thermally conductive sleeve includes a plurality of thermally conductive portions and a set of thermal insulators disposed between the thermally conductive portions.

9. The anti-stratification delivery system of claim 1 wherein the delivery system includes
   a draw tube configured to dispense the approximately uniform colloidal suspension, the draw tube having a portion disposed into the bottle and a portion extending from the bottle, and
   a thermal insulator disposed around the portion of the draw tube extending from the bottle.

10. The anti-stratification delivery system of claim 1 wherein:
    the first zone temperature controller includes a first housing having a first set of channels, the first set of channels being configured to carry a first coolant having a first temperature; and
    the second zone temperature controller includes a second housing having a second set of channels, the second set of channels being configured to carry a second coolant having a second temperature.

11. The anti-stratification delivery system of claim 10 wherein the first and second housings are aluminum.

12. The anti-stratification delivery system of claim 10 wherein the first and second zone temperatures are independently controllable.

13. The anti-stratification delivery system of claim 1 wherein:
the first and second zone temperature controllers are disposed horizontally adjacent; and
the temperature gradient is established horizontally across the liquid.

14. The anti-stratification delivery system of claim 1 wherein:
the first and second zone temperature controllers are disposed vertically adjacent; and
the temperature gradient is established vertically within the liquid.

15. The anti-stratification delivery system of claim 1 wherein the multi-zone refrigeration unit has more than first and second zone temperature controllers configured to establish the temperature gradient.

16. The anti-stratification delivery system of claim 1 wherein the colloid and liquid form a low-k spin-on-dielectric precursor.

17. A method of dispensing a colloid in liquid, the method comprising:
establishing a temperature gradient in the liquid and the colloid, including:
setting a first temperature in a region of the liquid; and
setting a second temperature, which is different from the first temperature, in another region of the liquid;
mixing the liquid and the colloid by natural thermal convection to an approximately uniform colloidal suspension; and
dispensing through a dispensing system the approximately uniform colloidal suspension.

18. The method of claim 17 further comprising setting a maximum temperature of the temperature gradient below an upper colloid-chemical-breakdown temperature.

19. The method of claim 17 wherein the liquid and colloid form a low-k spin-on-dielectric precursor.

20. An apparatus for storing, mixing, and dispensing a liquid solution for a semiconductor processing tool, the apparatus comprising:
a housing comprising a thermally conductive material, the housing having at least first and second sections that combine to form a cavity, the first and second sections being configured to be set at different temperatures;
a thermal insulator comprising a low thermal conductive material, the thermal insulator separating the first and second sections of the housing;
a lid attached to the housing that is removable to allow insertion and removal of a bottle from the cavity, the lid comprising an opening to allow for the insertion of a draw tube into a bottle; and
an insulating casing that at least partially surrounds the housing.

21. The apparatus of claim 20 further comprising a bottle suitable for containing the liquid solution.

22. The apparatus of claim 21 wherein the bottle is positioned within the cavity, a first portion of the bottle is in thermal contact with an interior surface of the first section of the housing and a second portion of the bottle is in thermal contact with an interior surface of the second section of the housing.

23. The apparatus of claim 21 further comprising a thermal insert forming another cavity, the thermal insert being positioned within the cavity of the housing, a first portion of the thermal insert is in thermal contact with an interior surface of the first section of the housing and a second portion of the thermal insert is in thermal contact with an interior surface of the second section of the housing, wherein the bottle is positioned within the cavity of the thermal insert.

24. The apparatus of claim 20 wherein the first section of the housing comprises a first fluid passage that allows a temperature controlled fluid to be circulated throughout the first section and the second section of the housing comprises a second fluid passage that allows a temperature controlled fluid to be circulated throughout the second section, wherein the second fluid passage is fluidically isolated from the first fluid passage.

25. The apparatus of claim 20 further comprising a heater coupled to one of the first or second sections of the housing and wherein the first and second sections of the housing comprise a fluid passage that allows a temperature controlled fluid to be circulated throughout the first and second sections of the housing.

26. The apparatus of claim 20 wherein the housing comprises a cylindrical sidewall and a bottom.

27. The apparatus of claims 26 wherein the thermal insulator divides the housing sidewall into upper and lower vertically oriented portions with respect to the cavity, and wherein the first section of the housing comprises a bottom portion and the lower portion of the sidewall and the second section of the housing comprises the upper portion of the sidewall.

28. The apparatus of claim 26 wherein the thermal insulator divides the housing sidewall and housing bottom into left and right horizontally oriented portions with respect to the cavity and wherein the first section of the housing comprises the left portion of the sidewall and bottom, and the second section of the housing comprises the right portion of the sidewall and bottom.

29. A method for forming an integrated circuit comprising:
mixing a spin-on-dielectric (SOD) formulation by natural thermal convection including
exposing a first portion of the SOD formulation to a first temperature, and
exposing a second portion of the SOD formulation to a second temperature, the difference between the first and second temperatures is sufficient to mix the SOD formulation to an approximately uniform colloidal suspension;
dispensing the SOD formulation onto a substrate; and
forming a low-k dielectric layer from the SOD formulation.

30. The method of claim 29 wherein the forming step includes curing the SOD formulation to form the low-k dielectric layer.

31. The method of claim 30 wherein the low-k dielectric layer has a dielectric constant below about 3.0.

32. The method of claim 30 wherein the low-k dielectric layer has a dielectric constant below about 2.0.

33. A method of dispensing a colloid in liquid, the method comprising:
establishing a temperature gradient in the liquid and the colloid;
setting a maximum temperature of the temperature gradient below an upper colloid-chemical-breakdown temperature;
mixing the liquid and the colloid by natural thermal convection to an approximately uniform colloidal suspension; and
dispensing through a dispensing system the approximately uniform colloidal suspension.

34. The method of claim 33, wherein the liquid and colloid form a low-k spin-on-dielectric precursor.

35. An anti-stratification-delivery system comprising:

a temperature-control unit having a fluid reservoir and having at least first and second temperature controllers that are configured to be set at different temperatures to establish a temperature gradient in a fluid that is disposed in the fluid reservoir, wherein the temperature gradient is sufficient to cause natural thermal convection within the fluid to stir a colloid suspended in the fluid to an approximately uniform colloidal suspension.

36. The anti-stratification-delivery system of claim 35, wherein the first and second temperature controllers are configured to cool the liquid.

37. The anti-stratification-delivery system of claim 35, wherein the first temperature controller is configured to heat the liquid or cool the liquid, and wherein the second temperature controller is configured to heat the liquid or cool the liquid.

38. The anti-stratification-delivery system of claim 35, wherein the temperature-control unit includes at least a first wall and a second wall configured to form at least a portion of the fluid reservoir, wherein the first temperature controller includes a first set of fluid controlled channels in the first wall, wherein the second temperature controller includes a second set of fluid controlled channels in the second wall, and wherein the first and second sets of fluid controlled channels are configured to establish the temperature gradient.

39. The anti-stratification-delivery system of claim 38, wherein the first set of fluid controlled channels include a first fluid having a first temperature, and wherein the second set of fluid controlled channels in a second fluid having a second temperature different from the first temperature.

40. The anti-stratification-delivery system of claim 39, wherein the first and second temperatures are from about −30° C. to about −5° C.

41. A fluid delivery system comprising:

a fluid reservoir having at least first and second temperature controllers that are configured to be set at different temperatures to establish a temperature gradient in a fluid that is disposed in the fluid reservoir, wherein the temperature gradient is sufficient to cause natural thermal convection within the fluid to stir a colloid suspended in the fluid to an approximately uniform colloidal suspension.

* * * * *